US011750992B2

(12) United States Patent
Ramamurthy et al.

(10) Patent No.: US 11,750,992 B2
(45) Date of Patent: Sep. 5, 2023

(54) INTEGRATED CIRCUIT WITH SWITCHING AMPLIFIER OUTPUT FAULT DETECTION

(71) Applicant: Texas Instruments Incorporated, Dallas, TX (US)

(72) Inventors: Venkata Ramanan Ramamurthy, Bengaluru (IN); Mohit Chawla, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/360,270

(22) Filed: Jun. 28, 2021

(65) Prior Publication Data

US 2022/0086577 A1 Mar. 17, 2022

(30) Foreign Application Priority Data

Sep. 17, 2020 (IN) .............................. 202041040238

(51) Int. Cl.
*H04R 29/00* (2006.01)
*G01R 31/56* (2020.01)
*H03F 3/217* (2006.01)

(52) U.S. Cl.
CPC ........... *H04R 29/001* (2013.01); *G01R 31/56* (2020.01); *H03F 3/217* (2013.01); *H03F 2200/03* (2013.01)

(58) Field of Classification Search
CPC ....... H04R 29/001; G01R 31/56; H03F 3/217; H03F 2200/03
See application file for complete search history.

(56) References Cited

U.S. PATENT DOCUMENTS

| 5,345,510 | A | 9/1994 | Singhi et al. |
| 5,990,751 | A | 11/1999 | Takita |
| 6,621,336 | B1* | 9/2003 | Johnson ................... H03F 3/217 330/51 |
| 7,193,469 | B2 | 3/2007 | Kaya |
| 7,944,287 | B2 | 5/2011 | Larson et al. |
| 10,476,458 | B2 | 11/2019 | Hurwitz et al. |
| 10,877,087 | B1* | 12/2020 | Joharapurkar ..... G01R 31/2825 |
| 2006/0195720 | A1* | 8/2006 | Watts ....................... H03F 3/217 714/11 |
| 2019/0305737 | A1* | 10/2019 | Saegusa .............. H03F 3/45475 |
| 2021/0344310 | A1* | 11/2021 | Zanbaghi .............. H03F 3/2173 |

OTHER PUBLICATIONS

International Search Report, PCT/US2021/050770, dated Dec. 2, 2021.

* cited by examiner

*Primary Examiner* — David L Ton
(74) *Attorney, Agent, or Firm* — John R. Pessetto; Frank D. Cimino

(57) ABSTRACT

A switching amplifier includes: a driver circuit with differential inputs and differential outputs; and a fault detection circuit coupled to the differential outputs. The fault detection circuit includes: a power supply input; and a sense circuit coupled to the differential outputs. The sense circuit includes: a first resistor between the power supply input and a positive output of the differential outputs; a second resistor between the positive output and ground; a third resistor between the power supply input and a negative output of the differential outputs; and a fourth resistor between the negative output and ground. The fault detection circuit also includes an analyzer circuit coupled to the sense circuit and configured to determine a fault location relative to the differential outputs based on an output of the sense circuit.

19 Claims, 6 Drawing Sheets

INTEGRATED CIRCUIT WITH SWITCHING AMPLIFIER OUTPUT FAULT DETECTION

CROSS-REFERENCE TO RELATED APPLICATIONS

This application claims priority to India Provisional Application No. 202041040238, filed Sep. 17, 2020, which is hereby incorporated by reference.

BACKGROUND

As new electronic devices are developed and integrated circuit (IC) technology advances, new IC products are commercialized. One example IC product for electronic devices is an analog signal chain or related switching amplifier (e.g., a class D amplifier). In some examples, the analog signal chain is part of audio system to control volume or equalization of an audio signal to be output to a speaker. The conductors or components between the switching amplifier outputs (OUTP/OUTN) and the speaker may have faults. Example faults include: a short between the switching amplifier outputs; a short or open circuit between either of the switching amplifier outputs and the voltage supply; and a short or open circuit between either of the switching amplifier outputs and ground. Conventional fault detection at the switching amplifier outputs does not support target performance parameters, such as compatibility with electromagnetic interference (EMI) bead filters having a bead frequency as low as 30 khz, minimal pop noise due to fault detection, and low latency detection.

SUMMARY

In one example embodiment, a switching amplifier comprises: a driver circuit with differential inputs and differential outputs; and a fault detection circuit coupled to the differential outputs. The fault detection circuit includes: a power supply input; and a sense circuit coupled to the differential outputs. The sense circuit includes: a first resistor between the power supply input and a positive output of the differential outputs; a second resistor between the positive output and ground; a third resistor between the power supply input and a negative output of the differential outputs; and a fourth resistor between the negative output and ground. The fault detection circuit also includes an analyzer circuit coupled to the sense circuit and configured to determine a fault location relative to the differential outputs based on an output of the sense circuit.

In another example embodiment, a system comprises: a power supply input; a switching amplifier with differential inputs and differential outputs; and a fault detection circuit coupled to the differential outputs. The fault detection circuit includes: a first resistive path with a first switch coupled between a positive output of the differential outputs and the power supply input; a second resistive path with a second switch coupled between the positive output of the differential outputs and ground; a third resistive path with a third switch coupled between a negative output of the differential outputs and the power supply input; a fourth resistive path with a fourth switch coupled between the negative output of the differential outputs and ground; and an analyzer circuit coupled to the differential outputs and configured to compare voltage or current attributes with predetermined thresholds to determine a fault location relative to the differential outputs, the power supply input, and ground.

In yet another example embodiment, a method is performed by a switching amplifier integrated circuit (IC) with differential outputs and an on-chip fault detection circuit. The method comprises: selectively enabling, by a set of switches, a first resistive path between a positive output of the differential outputs and a power supply, a second resistive path between the positive output and ground, a third resistive path between a negative output of the differential outputs and the power supply, a fourth resistive path between the negative output and ground. The method also comprises: applying, by the switching amplifier IC, a test signal at the differential outputs based on operating the set of switches; obtaining, by the switching amplifier IC, voltage or current attributes at the differential outputs resulting from the applied test signal; performing, by the switching amplifier IC, a comparison of the voltage or current attributes to thresholds associated with different faults; and identifying, by the switch amplifier IC, a fault based on the comparison.

BRIEF DESCRIPTION OF THE DRAWINGS

The same reference numbers (or other reference designators) are used in the drawings to designate the same or similar (structurally and/or functionally) features.

DETAILED DESCRIPTION

Figure 1:
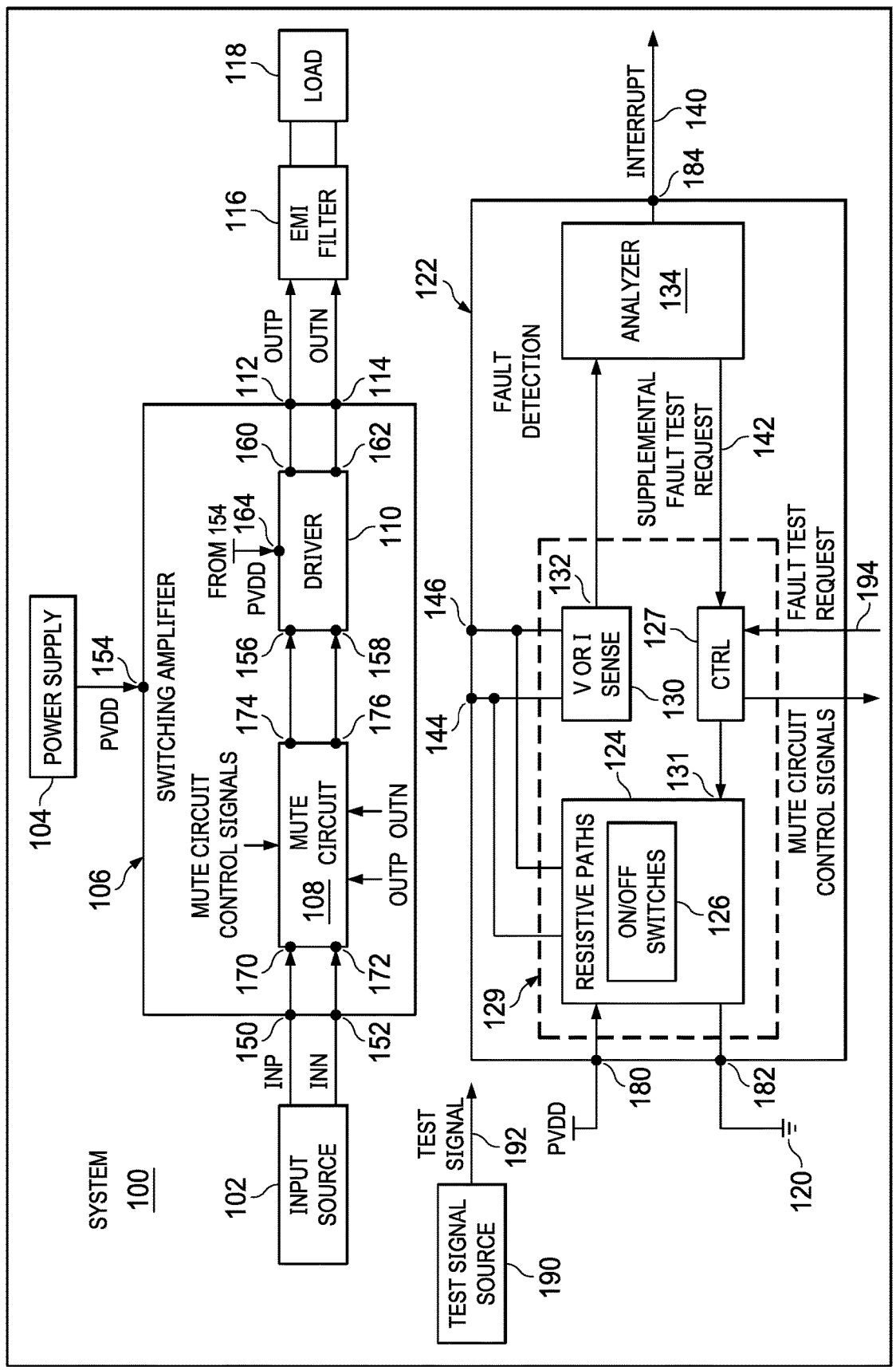
FIG. 1 is a block diagram of a system in accordance with an example embodiment.

Described herein is a switching amplifier with differential outputs and a related fault detection circuit coupled to the differential outputs. In some example embodiments, the switching amplifier and the fault detection circuit are part of an integrated circuit (IC), that may (for example) be included with other components on a single semiconductor die. Without limitation, the switching amplifier may be a Class D amplifier for use in an audio signal chain (e.g., between an audio signal source and a speaker).

In some example embodiments, the fault detection circuit includes: a power supply input; and a sense circuit coupled to the differential outputs. The sense circuit includes: a first resistor between the power supply input and a positive output of the differential outputs; a second resistor between the positive output and ground; a third resistor between the power supply input and a negative output of the differential outputs; a fourth resistor between the negative output and ground; and a voltage or current sense circuit coupled to the differential outputs. The fault detection circuit also includes an analyzer circuit coupled to the sense circuit. The analyzer circuit is configured to: perform analysis of measurements obtained by the voltage or current sense circuit; and determine a fault location relative to the differential outputs based on the analysis. In some example embodiments, the analyzer is configured to: obtain voltage or current attributes resulting from a test signal applied to the differential outputs; and perform a comparison of the voltage or current attributes with predetermined thresholds to determine the fault location relative to the differential outputs, the power supply input, and ground.

With the described fault detection circuit, amplifier output fault detection cost and performance parameters are improved relative to conventional approaches. An example conventional approach detects faults using a digital-to-analog converter (DAC) separate from the switching amplifier to force a test current. The voltage due to the forced current is measured using a single-ended analog-to-digital converter (ADC). The DAC and ADC are large and costly circuits. In contrast, with the fault detection circuit of example embodiments, an available pulse-width modulation (PWM) generator of the switching amplifier is used to generate a fault test signal or supplement a fault test signal (e.g., by generating a supplemental fault test signal). By selecting excitation frequencies below 20 Hz or above 20 khz for the fault test signal, audible artifacts during the fault test can be minimized. Also, various fault detection performance parameters are improved using the described fault detection circuit. Example fault detection performance parameters that are improved relative to conventional approaches include: support for electromagnetic interference (EMI) bead filters with the frequency of the bead as low as 30 khz; minimal pop noise due to the fault detection mechanism; and lower latency fault detection. Also, the described fault detection circuit has a simple design (e.g., a separate DAC and/or ADC relative to the switching amplifier is avoided) and can be on-chip (relative to the IC with the switching amplifier), which provides cost savings relative to conventional approaches.

FIG. 1 is a block diagram of a system 100 in accordance with an example embodiment. In some example embodiments, the system 100 is an electronic device (e.g., a smartphone, laptop computer, or other electronic device) with an audio subsystem and analog signal chain. As shown, the system 100 includes an input source 102 configured to provide a positive differential input (INP) signal and a negative differential input (INN) signal. In some example embodiments, the input source 102 includes a DAC or other source of analog audio signals. The system 100 also includes a power supply 104 configured to provide a power supply voltage (PVDD). INP, INN, and PVDD are received by respective inputs 150, 152, 154 of a switching amplifier 106. Specifically, input 150 is an INP input, input 152 is an INN input, and input 154 is a PVDD input. The switching amplifier 106 also includes a positive differential output (OUTP) 112 and a negative differential output (OUTN) 114.

As shown, the switching amplifier 106 includes a driver circuit 110 and a mute circuit 108. The mute circuit 108 is configured to provide a muting option during fault detection operations to avoid unwanted speaker noise (e.g., pops or other noise). For open loop switching amplifiers (e.g., no feedback loop is present), the mute circuit 108 may include logic gates to perform selective muting. For closed loop switching amplifier (e.g., a feedback loop is present), the mute circuit 108 may include switches along the feedback loop to perform selective muting. As shown, the mute circuit 108 includes a first input 170 coupled to the INP input 150, and second input 172 coupled to the INN input 152. The mute circuit 108 also includes first and second outputs 174 and 176. The first output 174 of the mute circuit 108 is coupled to a first input 156 of the driver circuit 110. The second output 176 of the mute circuit 108 is coupled to a second input 158 of the driver circuit 110. For a closed loop switching amplifier, OUTP and OUTN are also provided to the loop circuit 108. The mute circuit 108 also receives control signals, which may be gating signals (e.g., a logical 0 or 1) for open loop switching amplifiers or switch control signals for closed loop switching amplifiers.

In the example of FIG. 1, the driver circuit 110 includes first and second outputs 160 and 162. As shown, the first output 160 of the driver circuit 110 is coupled to the OUTP output 112, and the second output 162 of the driver circuit 110 is coupled to the OUTN output 114. The driver circuit 110 also includes a PVDD input 164 coupled to the PVDD input 154 or power supply 104. The OUTP and OUTN outputs 112 and 114 are coupled to a load 118 (e.g., an AC load speaker or DC load speaker). In some example embodiments, an electromagnetic interference (EMI) filter 116 is positioned between the load 118 and the OUTP and OUTN outputs 112 and 114. In operation, the driver circuit 110 is configured to amplify INP and INN (or a modified version of INP and INN) in accordance with a control signal (e.g., a PWM signal). If the load 118 is reactive (e.g., modeled as a resistor and inductor in series, or modeled as a resistor, inductor, and capacitor in series), the switching amplifier 106 (e.g., a class-D amplifier) provides efficiency benefits compared to other amplifier options (e.g., class A or class AB amplifiers).

In the example of FIG. 1, the switching amplifier 106 is a separate circuit or IC relative to the EMI filter 116 and the load 118. Due to conductor failure, component failure, and/or human error, the OUTP output 112 and/or the OUTN output 114 may be shorted to the power supply 104 (or related PVDD inputs 154 and 164) or common potential (e.g. ground). Other faults include a short or an open circuit between the OUTP and OUTN outputs 112 and 114.

To determine faults relative to the OUTP and OUTN outputs 112 and 114, the system 100 includes a fault detection circuit 122. In the example of FIG. 1, the fault detection circuit 122 includes fault test inputs 144 and 146 coupled to the OUTP and OUTN outputs 112 and 114. The fault test inputs 144 and 146 are also coupled to a test signal source 190 configured to provide a test signal 192 to the fault test inputs 144 and 146. In some example embodiments, the test signal source 190 is a PWM signal generator (not shown) of the switching amplifier 106. In such case, the test signal 192 includes PWM signals that are used to control on/off switches 126 of the fault detection circuit 122. In some example embodiments, the test signal source 190 is included with or is coupled to a controller 127. As shown, the fault detection circuit 122 also includes: a PVDD input 180 coupled to the power supply 104. The fault detection circuit 122 is also coupled to common potential (e.g. ground) 120 via input 182. The fault detection circuit 122 also includes a fault detection output 184.

In the example of FIG. 1, the fault detection circuit 122 includes a sense circuit 129 coupled to an analyzer circuit 134. The sense circuit 129 includes resistive paths 124 with on/off switches 126 coupled to the fault test inputs 144 and 146. In some example embodiments, the resistive paths 124 include: a first resistive path with a first resistor and a first on/off switch between the power supply input 180 and a positive output of the differential outputs (e.g., OUTP output 112); a second resistive path with a second resistor and second on/off switch between the positive output and ground 120; a third resistive path with a third resistor and third on/off switch between the power supply input 180 and a negative output of the differential outputs (e.g., OUTN output 114); and a fourth resistive path with a fourth resistor and a fourth on/off switch between the negative output and ground. The sense circuit 129 also includes a voltage or current sense circuit 130 coupled to the fault test inputs 144 and 146. In operation, the controller 127 of the sense circuit 129 is configured to provide a set of control signals 131 to the on/off switches 126 responsive to a fault test request 194. In one example, the set of control signals 131 corresponds to the test signal 192, where the set of control signals turn on the first, second, third, and fourth on/off switches in a pattern to generate a waveform (e.g., INPUT in FIG. 4) at the switching amplifier outputs during a fault test initiated by the fault test request 194. As another option, the controller 127 is configured to provide a set of control signals 131 to the on/off switches 126 responsive to a supplemental fault test request 142. In such case, the set of control signals 131 may turn on the first, second, third, and fourth on/off in separate test intervals during a fault test initiated the supplemental fault test request 142. The set of control signals 131 may control the on/off switches 126 in different combinations to test for faults.

Regardless of the particular fault test being performed, the output 132 of the voltage or current sense circuit 130 is provided to the analyzer circuit 134. The analyzer circuit 134 is configured to: perform analysis of measurements obtained by the voltage or current sense circuit 130; and determine a fault location relative to the differential outputs 112 and 114 based on the analysis. In some example embodiments, the analyzer circuit 134 is configured to: obtain voltage or current attributes resulting from a test signal (e.g., the test signal 192) that generates a waveform at the OUTP and OUTN outputs 112 and 114 (or the fault test inputs 144 and 146); and perform a comparison of the voltage or current attributes with predetermined thresholds to determine a fault location relative to the OUTP and OUTN outputs 112 and 114, the power supply input 180, and ground 120. In some example embodiments, the measurements or related attributes are individual or averaged voltage samples. In some example embodiments, the measurements or related attributes are individual or averaged current samples. In some scenarios, the analyzer circuit 134 may determine that there is a fault, but more information is needed to determine the fault location. Is such case, the analyzer circuit 134 asserts the supplemental fault test request 142 to the controller 127 to initiate a supplemental fault test. In response to determining a fault location (based on the analysis results of a fault test and/or supplemental fault test), the analyzer circuit 134 is configured to assert the interrupt 140 at the fault detection output 184. In response to the interrupt 140, a fault handling controller (not shown) may turn off the switching amplifier 106 and/or other components. As another option, assertion of the interrupt 140 results in display of the fault location, transmission of fault location information, storage of fault location information for later consideration, and/or other response options.

Without limitation to other examples, the analyzer circuit 134 may include comparators coupled to the voltage or current sense circuit 130 and configured to compare obtained measurements or attributes (e.g., resulting from application of the test signal 192) with predetermined thresholds associated with a positive output short to power supply fault (ps_sup), a negative output short to power supply fault (ns_sup), a positive output short to ground fault (ps_gnd), and a negative output short to ground fault (ns_gnd). In another example embodiment, the analyzer circuitry 134 includes: an ADC with an ADC input and ADC output; and a processor coupled to the ADC output. In this example embodiment, the ADC input is coupled to the voltage or current sense circuit 130 and is configured to digitize measurements or attributes resulting from application of a test signal (e.g., the test signal 192) at the OUTP and OUTN outputs 112 and 114 of the switching amplifier 106. The processor is configured to: perform a comparison of the digitized measurements or attributes with predetermined thresholds associated with a positive output short to power supply fault, a negative output short to power supply fault, a positive output short to ground fault, and a negative output short to ground fault; and determine the fault location based on the comparison.

In some example embodiments, the sense circuit 129 or the analyzer circuit 134 is configured to average measurements obtained by the voltage or current sense circuit 130 over time, and the analyzer circuit 134 is configured to analyze the averaged measurements to determine the fault location. In some example embodiments, the analyzer circuit 134 is configured to: determine that analysis of the measurements or attributes is inconclusive; and initiate a supplemental fault test (e.g., by asserting the supplemental fault test request 142) in which the controller 127 is configured to turn on the first, second, third, and fourth on/off switches in separate test intervals.

In some example embodiments, the switching amplifier 106 includes: a mute circuit (e.g., the mute circuit 108) coupled to the INP and INN inputs 150 and 152; and a mute circuit controller (e.g., the controller 127 or another controller) coupled to mute circuit switches. In some example embodiments, the mute circuit controller is configured to prevent propagation of audio input source signaling through the mute circuit during a fault test in which the voltage or current attributes resulting from the applied test signal are obtained.

Figure 2:
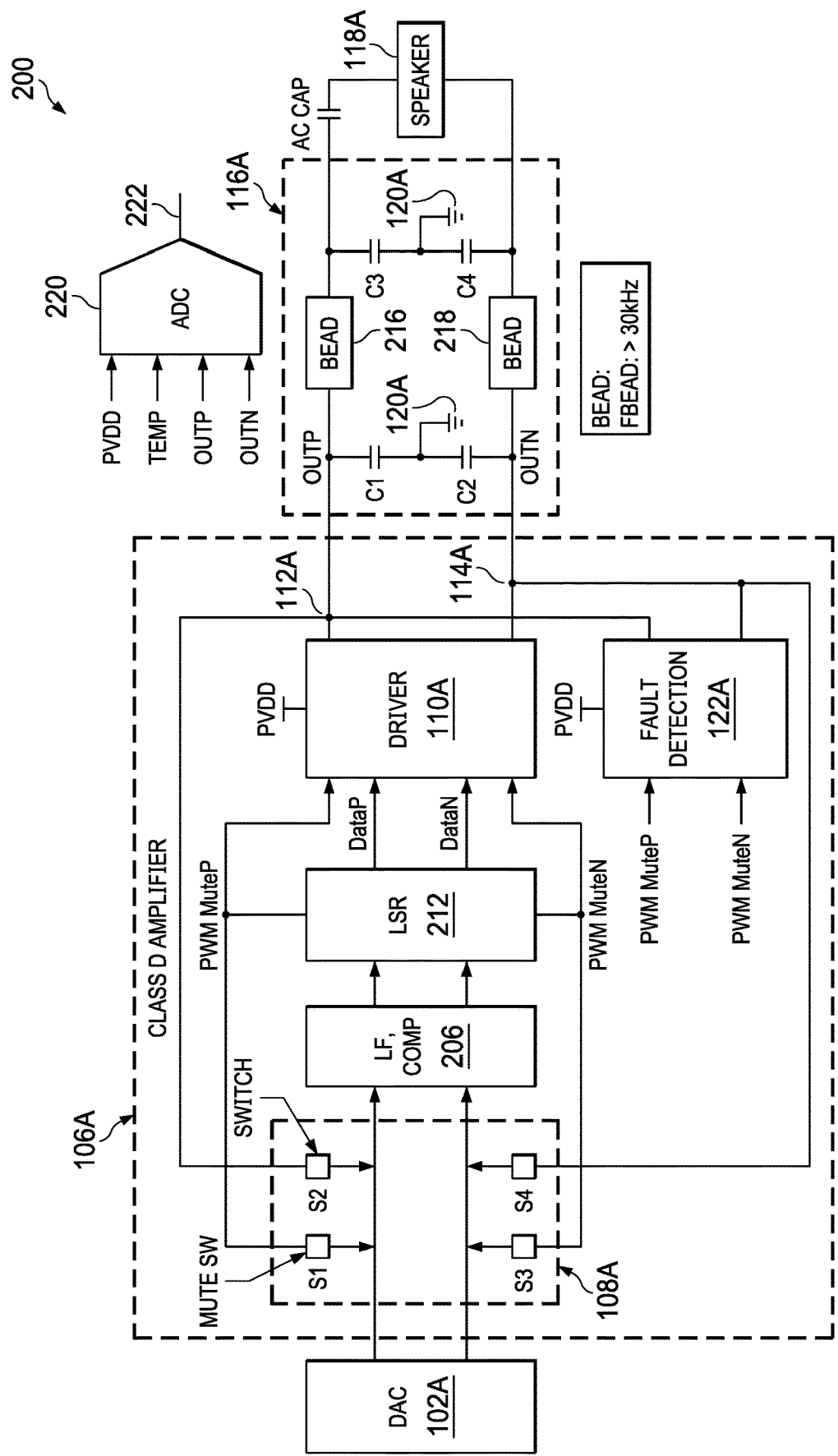
FIG. 2 is a block diagram of an audio system in accordance with another example embodiment.

FIG. 2 is a block diagram of an audio system 200 in accordance with another example embodiment. In some example embodiments, the audio system 200 is part of a system (e.g., the system 100 of FIG. 1) such as electronic device (e.g., a smartphone, laptop computer, or other electronic device). As shown, the audio system 200 includes a DAC 102A (an example of the input source 102 in FIG. 1) or other analog signal source. The output of the DAC 102A is coupled to a class D amplifier 106A (an example of the switching amplifier 106 in FIG. 1). In the example of FIG. 2, the class D amplifier 106A includes loop filter (LF) and comparator circuit 206, a low-side recycle (LSR) circuit 212, and a driver circuit 110A (an example of the driver circuit 110 in FIG. 1). The LF and comparator circuit 206 and the LSR circuit 212 control PWM signal generation for the class D amplifier 106A, where the PWM signals are used to control amplification by the driver 110A. In some example embodiments, the LF and comparator circuit 206 includes a ramp generator. As another option, the LF and comparator circuit 206 may be omitted. As yet another option, the LSR circuit 212 may additionally or alternatively be omitted. When a feedback loop is used (e.g., the feedback loop in FIG. 2 includes the LF and comparator circuit 206 and/or the LSR circuit 212, a mute circuit 108A with switches to selectively complete the feedback loop is included. In the example of FIG. 2, the mute circuit 108A includes four switches S1, S2, S3 and S4.

There are multiple ways to categorize class D amplifiers such as the class D amplifier 106A. One such way is based on whether there is a feedback loop or not. An open loop class D amplifier has no feedback loop, and a closed loop class D amplifier has a feedback loop. In an open loop class D amplifier, the input is converted to a PWM signal by a comparator (e.g., the comparator of the LF and comparator circuit 206 in FIG. 2), and the output of the comparator goes to power transistors (e.g., M1, M2, M3 and M4 in FIG. 3) of a driver (e.g., driver 110A in FIG. 2) and related gate drivers for the power transistors. For an open loop class D amplifier, mute functionality may be added by gating DataP and DataN going to driver 110A (e.g., AND gating DataP and DataN with "0" to mute, or AND gating DataP and DataN with "1" to not mute). In other words, the mute circuit 108A of FIG. 2 is for a closed loop class D amplifier embodiment rather than an open loop class D amplifier embodiment. For the open loop class D amplifier, the mute circuit 108A may be replaced by gating DataP and DataN as described previously.

In a closed loop class D amplifier, there is a primary feedback loop from the OUTP/OUTN outputs to the input of loop filter ("LF" in the LF and comparator circuit 206). This primary feedback loop is completed in FIG. 2 using switches S2 and S4. The mute circuit 108A also includes an additional loop through S1 and S3 to control undesirable speaker noise (e.g., popping noise). During fault test diagnostics, the output of the LF and comparator circuit 206 is fed back to the input of the additional loop via signal lines (labeled "PWM MuteP" and "PWM MuteN"), instead of OUTP and OUTN in the primary feedback loop. In the example of FIG. 2, PWM MuteP and PWM MuteN are PWM control signals represented as being output from the LSR circuit 212. In other example embodiments, PWM MuteP and PWM MuteN are output from the LF and comparator circuit 206. As shown, the data signal (labeled "DataP" and "DataN") output from the LF and comparator circuit 206 is also sent to the driver 110A via LSR 212. However, the loop is not closed at OUTP/OUTN during fault test diagnostics due to the output impedance being very high. More specifically, in some example embodiments, sense circuit transistors (e.g., M5-M8 in FIG. 3) may have impedances of 10-100Ω, whereas driver circuit transistors (e.g., M1-M4 in FIG. 3) may have impedances of 30-500 mΩ, which can cause stability issues. An unstable loop cannot correctly represent OUTP/OUTN as desired. This is fixed by closing the primary feedback loop through the mute circuit 108A while still allowing the signal to pass through to the output via M5-M8 for fault test diagnostic operations.

In operation, the mute circuit 108A ensures loop stability and correct operation during fault detection diagnostics. This muting operation is performed, for example, during a fault test or supplemental fault test performed by a fault detection circuit 122A (an example of the fault detection circuit 122 in FIG. 1) as described herein. As shown, the fault detection circuit 122A is coupled to the OUTP and OUTN outputs 112A and 114A.

In the example of FIG. 2, the LSR circuit 212 outputs differential data signals (e.g., an audio signal) (DataP and DataN) and differential PWM control signals (PWM MuteP and PWM MuteN). As shown, the DataP, DataN, PWM MuteP, and PWM MuteN are provided by the LSR circuit 212 to the driver circuit 110A. Also, the PWM MuteP and PWM MuteN signal are provided by the LSR circuit 212 to the mute circuit 108A to control S1 and S3. The PWM MuteP and PWM MuteN signals are also provided to the fault detection circuit 122A (e.g., the PWM MuteP and PWM MuteN signals indicate when to initiate fault detection operations). As shown, the driver circuit 110A and the fault detection circuit 122A receive PVDD, and the outputs of the driver circuit 110A are coupled to the OUTP and OUTN outputs 112A and 114A.

As shown, the OUTP and OUTN outputs 112A and 114A are also coupled to the fault detection circuit 122A and to a speaker 118A (an example of the load 118 in FIG. 1) via an EMI filter 116A (an example of the EMI filter 116 in FIG. 1). In some example embodiments, the EMI filter 116A includes capacitors C1, C2, C3 and C4 and bead filters 216 and 218 in the arrangement shown. More specifically, C1 is coupled between the OUTP output 112A and common potential (e.g. ground) 120A (an example of ground 120 in FIG. 1), and C2 is coupled between the OUTN output 114A and ground 120A. Also, a bead filter 216 is coupled between the OUTP output 112A and a first side of an alternating-current (AC) capacitor (AC cap), where a first side of the speaker 118A is coupled to a second side of the AC cap. C3 is coupled between the first side of the AC cap and ground 120A. The bead filter 218 is coupled between the OUTN output 114A and a second side of the speaker 118A. C4 is coupled between the second side of the speaker 118A and ground 120A. In some example embodiments, the bead filters 216 and 218 operate to filter frequencies above a threshold (e.g., 30 Khz). In some example embodiments, the variance of the bead filters 216 and 218 or other components increases the difficulty of fault detection. As needed, averaged measurements or attributes resulting from application of a test signal to the OUTP and OUTP outputs 112A and 114A are used for fault detection.

As shown, the audio system 200 also includes an ADC 220 with inputs adapted to receive PVDD, a value indicative of a temperature (Temp), OUTP, and OUTM. The output of the ADC 220 includes digitized values of PVDD, Temp, OUTP, and OUTM, which may be stored and/or analyzed. As another option, multiple ADCs may be used. In one example embodiment, a differential voltage measurement of the OUTP and OUTN outputs is used to detect a fault. Such measurements can be analyzed inside the IC with the class D amplifier 106A to detect a fault. Additionally or alternatively, information on any detected faults may be shared with a host and/or raw data can be shared with a host for further analysis.

Figure 3:
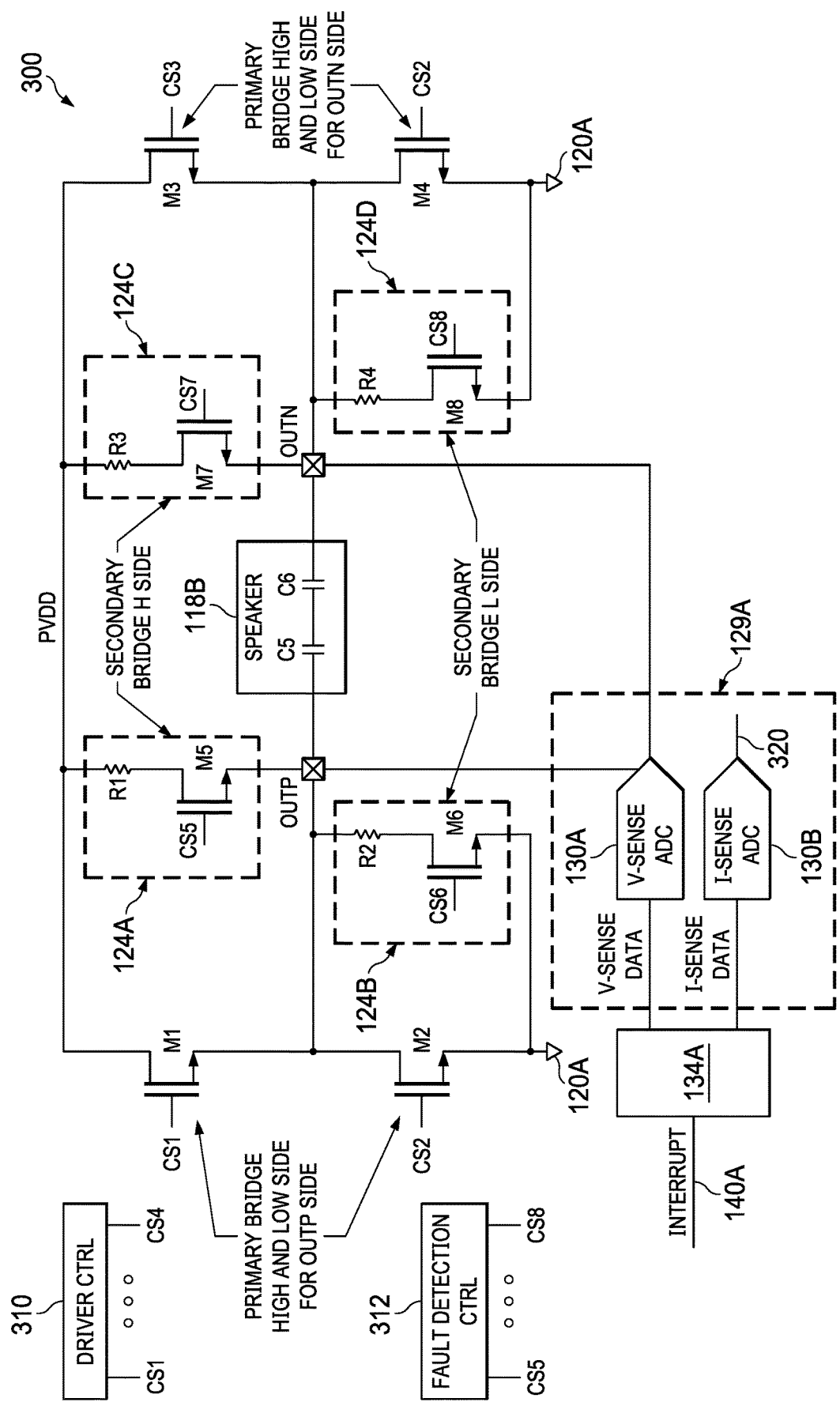
FIG. 3 is a diagram of a switching amplifier and a fault detection circuit in accordance with an example embodiment.

FIG. 3 is a diagram 300 of a switching amplifier and a fault detection circuit in accordance with an example embodiment. In the diagram 300, a driver circuit (e.g., the driver circuit 110 in FIG. 1, or the driver circuit 110A in FIG. 2) is formed using transistors M1, M2, M3 and M4 in an H-bridge arrangement. Specifically, M1 is a n-type metal-oxide semiconductor field-effect transistor (MOSTFET or "nMOS" transistor) with a first current terminal (e.g., a drain terminal) coupled to a PVDD input or source (e.g., the power supply 104 or related inputs 154, 164, 180 in FIG. 1), a second current terminal (e.g., a source terminal) coupled to the OUTP output 112A, and a control terminal (e.g. a gate) coupled to a driver controller 310 and adapted to receive a control signal (CS1). In different example embodiments, the driver controller 310 is PWM generator for an open loop switching amplifier or a closed loop switching amplifier. In either case, M1 operates as a primary bridge high-side transistor for the OUTP output 112A. M2 is an nMOS transistor with a first current terminal (e.g., a drain terminal) coupled to the OUTP output 112A, a second current terminal (e.g., a source terminal) coupled to ground 120A, and a control terminal (e.g. a gate) coupled to the driver controller 310 and adapted to receive a control signal (CS2). M2 operates as a primary bridge low-side transistor for the OUTP output 112A. M3 is an nMOS transistor with a first current terminal (e.g., a drain terminal) coupled to a PVDD input or source, a second current terminal (e.g., a source terminal) coupled to the OUTN output 114A, and a control terminal (e.g. a gate) coupled to the driver controller 310 and adapted to receive a control signal (CS3). M3 operates as a primary bridge high-side transistor for the OUTN output 114A. M4 is an nMOS transistor with a first current terminal (e.g., a drain terminal) coupled to the OUTN output 114A, a second current terminal (e.g., a source terminal) coupled to ground 120A, and a control terminal (e.g. a gate) coupled to the driver controller 310 and adapted to receive a control signal (CS4). M4 operates as a primary bridge low-side transistor for the OUTN output 114A.

In the diagram 300 of FIG. 3, fault detection is based on a sense circuit 129A (an example of the sense circuit 129 in FIG. 1) with resistive paths (e.g., resistive paths 124 in FIG. 1) that include respective resistors R1, R2, R3 and R4. The resistive paths also include respective on/off switches (e.g., on/off switches 126 in FIG. 1) in the form of transistors M5, M6, M7 and M8 in an H-bridge arrangement. Specifically, M5 is an nMOS transistor with a first current terminal (e.g., a drain terminal) coupled to a PVDD input or source via R1, a second current terminal (e.g., a source terminal) coupled to the OUTP output 112A, and a control terminal (e.g. a gate) coupled to a fault detection controller 312 (e.g., the controller 127 or test signal source 190 in FIG. 1) and adapted to receive a control signal (CS5). M5 operates as a secondary (fault test) bridge high-side transistor for the OUTP output 112A. M6 is an nMOS transistor with a first current terminal (e.g., a drain terminal) coupled to the OUTP output 112A via R2, a second current terminal (e.g., a source terminal) coupled to ground 120A, and a control terminal (e.g. a gate) coupled to the fault detection controller 312 and adapted to receive a control signal (CS6). M6 operates as a secondary (fault test) bridge low-side transistor for the OUTP output 112A. M7 is an nMOS transistor with a first current terminal (e.g., a drain terminal) coupled to a PVDD input or source via R3, a second current terminal (e.g., a source terminal) coupled to the OUTN output 114A, and a control terminal (e.g. a gate) coupled to the fault detection controller 312 and adapted to receive a control signal (CS7). M7 operates as a secondary (fault test) bridge high-side transistor for the OUTN output 114A. M8 is an nMOS transistor with a first current terminal (e.g., a drain terminal) coupled to the OUTN output 114A via R4, a second current terminal (e.g., a source terminal) coupled to ground 120A, and a control terminal (e.g. a gate) coupled to the fault detection controller 312 and adapted to receive a control signal (CS8). M8 operates as a secondary (fault test) bridge low-side transistor for the OUTN output 114A.

In the example of FIG. 3, a speaker 118B (an example of the load 118 in FIG. 1, or the speaker 118A in FIG. 2) is coupled between the OUTP and OUTN outputs via capacitors C5 and C6, which may be considered part of the speaker 1186 for purposes of fault detection. In other words, faults are detected relative to the OUTP and OUTN outputs, and not relative to terminals of the speaker 118B. As shown, the sense circuit 129A also includes a voltage sense circuit 130A and/or a current sense circuit 1306 (examples of the voltage or current sense circuit 130 in FIG. 1). In the example of FIG. 3, the voltage sense circuit 130A includes an ADC configured to output voltage sense data (labeled "V-sense data" such as digitized voltage samples and/or averaged voltage samples) to an analyzer circuit 134A (an example of the analyzer circuit 134 in FIG. 1). Also, the current sense circuit 130B includes an ADC configured to output current sense data (labeled "I-sense data" such as digitized current samples and/or averaged current samples) to the analyzer circuit 134A from a sense current 320, which may be obtained by a loop sensor (not shown) at one or both of the OUTP and OUTN outputs. The sense current 320 is proportional to the voltages at the OUTP and OUTN outputs and can be used for fault detection in a similar manner as sense voltages (i.e., different levels of voltage or current indicate different faults or no fault). Without limitation to combination techniques, voltage sense and current sense options for fault detection may be considered alternative options (use one or the other).

Regardless of the particular fault test (e.g., a primary fault test, a supplemental fault test) being performed, the analyzer circuit 134A is configured to: perform analysis of measurements obtained by the voltage or current sense circuits 130A and 130B; and determine a fault location relative to the differential outputs 112A and 114A based on the analysis. In some example embodiments, the analyzer circuit 134A is configured to: obtain voltage or current attributes resulting from a test signal (e.g., the test signal 192) applied to the OUTP and OUTN outputs 112A and 114A; and perform a comparison of the voltage or current attributes with predetermined thresholds to determine a fault location relative to the OUTP and OUTN outputs 112A and 114A, a PVDD source or input, and ground 120A. In some example embodiments, the measurements or related attributes are instantaneous voltage or averaged voltage samples (e.g., the differential voltage between the OUTP and OUTN outputs 112A and 114A) resulting from application of the test signal to the OUTP and OUTN outputs 112A and 114A. In some example embodiments, the measurements or related attributes are instantaneous current or averaged current samples. In some scenarios, the analyzer circuit 134A may determine that there is a fault, but more information is needed to determine the fault location. Is such case, the analyzer circuit 134A asserts a supplemental fault test request (e.g., the supplement fault test request 142 in FIG. 1) to the fault detection controller 312 to initiate a supplemental fault test. In response to determining a fault location (based on the analysis results of a fault test and/or supplemental fault test), the analyzer circuit 134A is configured to assert an interrupt 140A (an example of the interrupt 140 in FIG. 1). In response to the interrupt 140A, a fault handling controller (not shown) may turn off the switching amplifier and/or other components. As another option, assertion of the interrupt 140A results in display of the fault location, transmission fault location information, storage of fault location information for later consideration, and/or other response options.

Figure 4:
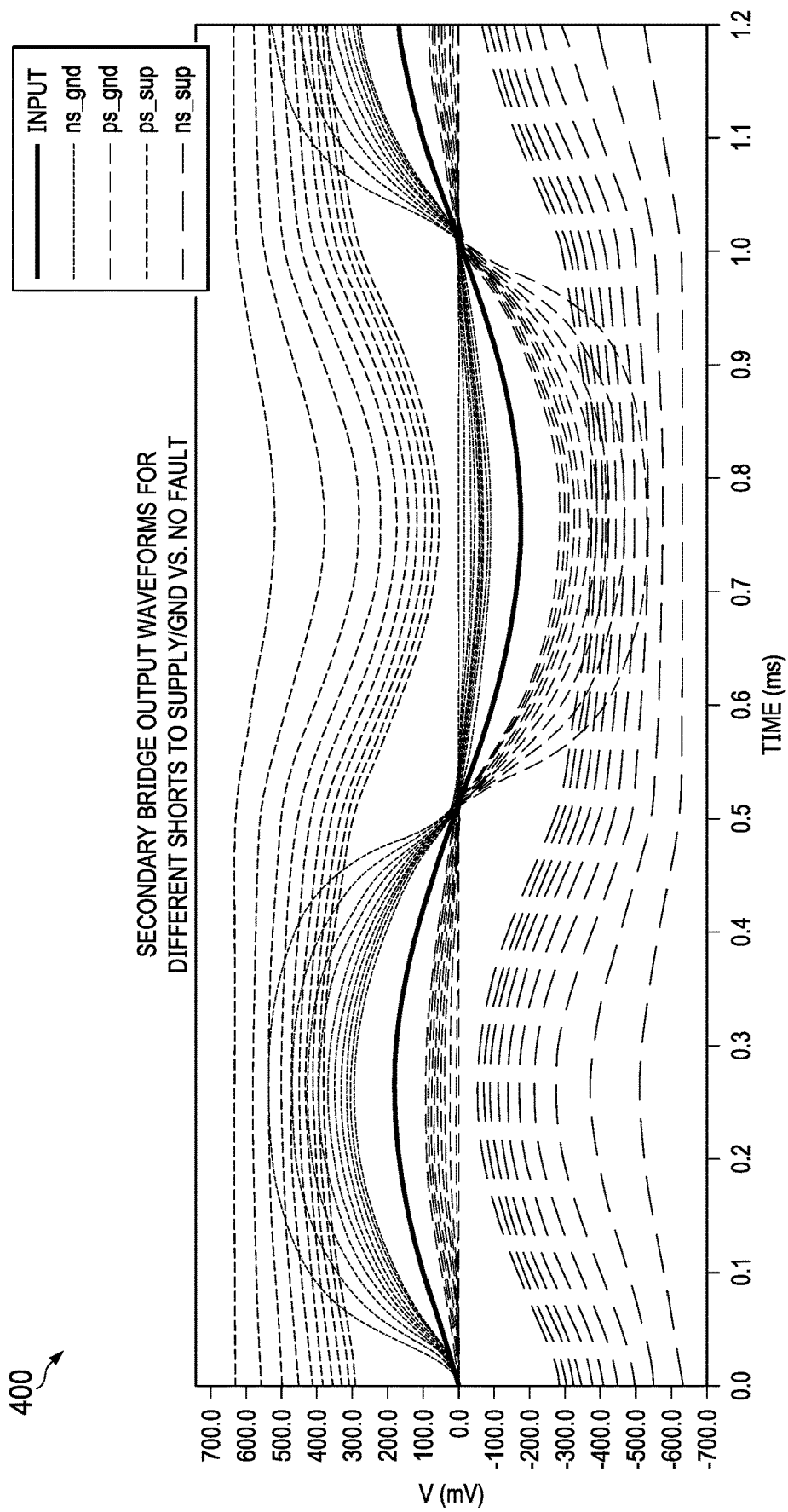
FIG. 4 is a timing diagram of a test signal and resulting waveforms with attributes that vary depending on different faults at the differential outputs of a switching amplifier in accordance with an example embodiment.
Figure 5:
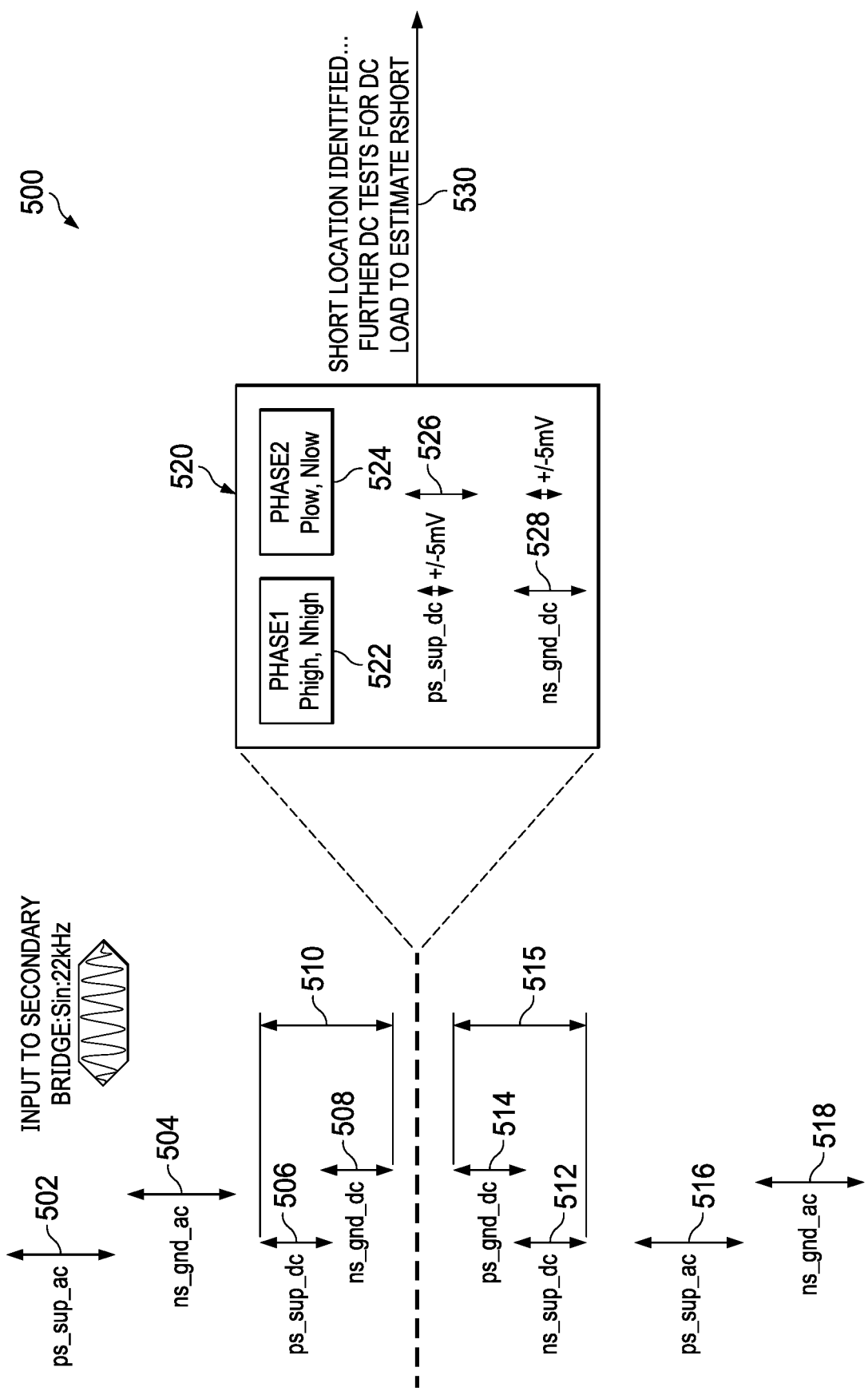
FIG. 5 is a diagram of analysis related to a switching amplifier output fault test in accordance with an example embodiment.

Without limitation to other examples, the analyzer circuit 134A may include comparators configured to compare obtained measurements and/or voltage or current attributes (e.g., resulting from application of a test signal to the OUTP and OUTN outputs 112A and 114A) with predetermined thresholds associated with ps_sup, ns_sup, ps_gnd, ns_gnd faults (see e.g., FIGS. 4 and 5). In another example embodiment, the analyzer circuitry 134A includes: a processor coupled to an ADC output. The processor is configured to: perform a comparison of the digitized measurements or attributes with predetermined thresholds associated with a positive output short to power supply fault, a negative output short to power supply fault, a positive output short to ground fault, and a negative output short to ground fault; and determine the fault location based on the comparison.

In some example embodiments, the sense circuit 129A or the analyzer circuit 134A is configured to average measurements obtained by the voltage or current sense circuits 130A or 130B over time, and the analyzer circuit 134A is configured to analyze the averaged measurements to determine the fault location. In some example embodiments, the analyzer circuit 134A is configured to: determine that analysis of the measurements or attributes is inconclusive and initiate a supplemental fault test (e.g., by asserting the supplemental fault test request 142) in which the fault detection controller 312 is configured to turn on the first, second, third, and fourth on/off switches (M5-M8), via signals CS5, CS6, CS7 and CS8, in separate test intervals.

In some example embodiments, each of the resistive paths 124A, 124B, 124C, and 124D (part of the sense circuit 129A) is calibrated at room temperature and is in parallel to the primary H bridge of a class D amplifier. In different example embodiments, the speaker 118B may be a direct-current (DC) load or AC load. A DC load speaker is represented as a resistor and inductor in series. An AC load speaker is represented as a resistor and decoupling capacitor in series. Therefore, in some example embodiments, speaker 118 6 is represented as a resistor and an inductor in series between C5 and C6, while, in other example embodiments, speaker 118B is represented as a resistor and a decoupling capacitor in series between C5 and C6.

Whenever there is a fault (e.g., a short to the power supply or ground), the primary bridge formed by M1-M4 should not be turned on (e.g. M1-M4 are turned off via signals CS1-CS4). Accordingly, during a fault test, the secondary bridge formed M5-M8 is used (e.g. M5-M8 are turned off via signals CS5-CS8) and will limit the currents to avoid damage to the related audio system and/or other components. In some example embodiments, the fault test is performed on each power up. In most of the cases, where there is no fault, turning on the on/off switches of the secondary bridge one by one and measuring the voltage at the OUTP and OUTN outputs would create an audible pop. To avoid this audible pop, at least some embodiments use a test signal that is not audible (e.g., a sine wave having a frequency around 22 kHz). Also, the amplitude of the test signal may be ramped up slowly from zero to full value to avoid audible pops. If there is no fault, the test signal may cause a negligible pop. As desired, a mute circuit (e.g., the mute circuit 108 in FIG. 1) may be used to help reduce audible pops due to fault testing.

In some example embodiments, a DAC or other analog signal source supplies a sinusoidal test signal (e.g., approximately 22 kHz or higher) into the mute circuit which creates PWM signals (PWM muteP and PWM muteN in FIG. 1). The sinusoidal PWM signals are supplied to the speaker load via the secondary bridge, where the secondary bridge is in an open loop configuration. The expected result of OUTP minus OUTN sensed (after sufficiently filtering the out-of-band components of the PWM signals) is also a sinusoidal wave. When a speaker load is present and when there is no short fault to power supply/ground, the sine output amplitudes will have lower amplitudes. Since the secondary bridge has considerable output impedance (e.g., approximately 230 ohms) to limit the current during a short event, the voltage across the load is due to the voltage division that happens between the load impedance and the output impedance of the secondary bridge.

FIG. 4 is a diagram 400 of a test signal and resulting waveforms with attributes that vary depending on different faults at the differential outputs of a switching amplifier in accordance with an example embodiment. In the diagram 400, the waveforms include a test waveform (INPUT). In some example embodiments, INPUT is the filtered output (OUTP-OUTN) of the switching amplifier in the no load case. In other words, driving PWM pulses result in a full scale sinusoidal signal such as INPUT. However, due to the secondary bridge output impedance and the load impedance, there will be some attenuation at the output in practice. With no faults, this is still a sine wave that averages to about zero. The waveforms in the diagram 400 also include: an OUTN output to ground waveform (ns_gnd); an OUTP output to ground waveform (ps_gnd); an OUTP output to power supply waveform (ps_sup); and an OUTN output to power supply waveform (ns_sup).

In the example of FIG. 4, INPUT is a 22 kHz sinusoidal waveform described as a test signal applied to the OUTP and OUTN outputs. In practice, INPUT is the differential signal at the OUTP and OUTN outputs resulting from controlling M5-M8 using pulse width modulated signals (e.g., CS5, CS6, CS7, and CS8). Responsive to INPUT, one of the ns_gnd, ps_gnd, ps_sup, and ns_sup waveforms is possible (within respective ranges). The ranges are due to OUTP and OUTN being connected to the speaker through a long cable which is resistive in nature. In some fault conditions, this cable may be shorted to the power supply or ground as these cables are routed as part of a cable harness. Depending on the location of the short, the resistance of the short may vary. The ranges given for ns_gnd, ps_gnd, ps_sup, and ns_sup assume short resistances due to the speaker cable or other components ranging from 0 to 50 Ohms. Additional variations in short resistance may be due to output impedance variations of the switching amplifier IC due to process and temperature. It is also possible for multiple faults to be present. To determine that there is a fault, measurements or attributes of the waveform at the OUTP and OUTN outputs responsive to INPUT is obtained and compared with the ranges for ns_gnd, ps_gnd, ps_sup, and/or ns_sup. In some example embodiment, multiples voltage or current samples of the signal at the OUTP and OUTN outputs responsive to INPUT are obtained and analyzed (e.g., compared with the ranges for ns_gnd, ps_gnd, ps_sup, and/or ns_sup). As another option, an average voltage or current at the OUTP and OUTN outputs responsive to INPUT is obtained and analyzed (e.g., compared with the ranges for ns_gnd, ps_gnd, ps_sup, and/or ns_sup).

In FIG. 4, the plotted ns_gnd, ps_gnd, ps_sup, and ns_sup waveforms are for cases when the bead filter is not present and the variation for each of the faults is due to: the short resistance (to supply or ground) varying from 0 ohms to 50 ohms; speaker impedance variations and output impedance variations of the secondary bridge due to process and temperature. Using the concept that a rectified wave is present when there is a short to PVDD or ground, a fault test as described herein may involve measuring the amplitudes of the output wave during the positive and negative cycles corresponding to the input wave.

In addition to the speaker load inductances, the described fault tests and related analysis support bead filters in automotive applications that can vary from as low as 30 kHz to a few hundreds of kHz. Such ferrite bead filters or LC filters are added at the output of the switching amplifier to reduce EMI. As Class-D OUTP and OUTM are switching voltages, these voltages can cause system level EMI which mandates use of LC Filters at the output of device. The output of these filters is connected to a cable which is routed to the speakers which has vulnerability to voltage supply (e.g., battery) and ground shorts as it is routed as part of a cable harness. The described fault detection options are compatible with a wide range of ferrite bead filters as well and works reliably with filters range from 30 KHz onwards. In some examples, the presence of ferrite bead or LC filters results in some variations in the waveform amplitudes for fault scenarios due to the variations of L and C (the waveform won't look like a rectified sine wave due to the filtering effect of the bead filter). In such examples, the effect of the bead filter is accounted for during fault detection by using averaged measurements. Note: the described fault detection options work equally well with or without the presence of bead filters.

In some example embodiments, in normal load conditions, the switching amplifier device measures voltage, which is a divided down version of the device output impedance and load impedance. As an example, assume a load resistance of 8 ohms and a device output impedance of 100 ohms. In no fault conditions, the expect output is 8*V/108, where V is the voltage level from the device. For open load, there will be very limited attenuation as the load is not present and minimal attenuation is seen due to the ferrite bead filter. This can be used for detection of open load. As an example, when the speaker load is completely open or large, larger sinusoids at 22 khz will be seen at the output (compared to when there is a load) as there is less voltage division between the load and the output impedance of the secondary driver. The presence of ferrite bead filters at the output would reduce the amplitude of the output sinusoid in case of an open circuit fault, but the output sinusoid would still be far greater than the scenario where a load (e.g., 4 or 8 ohm) is present. For single short fault detection corresponding to ns_gnd, ps_gnd, ps_sup, and ns_sup, the average of the output wave will shift in a detectable manner. For a no fault scenario, the average of these signals would tend to '0' (subject to offset errors of the signal chain, which can be designed to be low). As needed, it is possible to test for individual faults or different combinations of faults in response to ambiguities or inconclusive testing.

FIG. 5 is a diagram 500 of analysis related to a switching amplifier output fault test in accordance with an example embodiment. In the diagram, various voltage ranges 502, 504, 506, 508, 512, 514, 516, and 518 corresponding to different types of faults are shown. The voltage range 502 and related thresholds are used to identify a ps_sup fault for an AC load speaker (ps_sup_ac). The voltage range 504 and related thresholds are used to identify an ns_gnd fault for an AC load speaker (ns_gnd_ac). The voltage range 506 and related thresholds are used to identify a ps_sub fault for a DC load speaker (ps_sup_dc). The voltage range 508 and related thresholds are used to identify an ns_gnd fault for a DC load speaker (ns_gnd_dc). The voltage range 512 and related thresholds are used to identify an ns_sup fault for a DC load speaker (ns_sup_dc). The voltage range 514 and related thresholds are used to identify an ps_gnd fault for a DC load speaker (ps_gnd_dc). The voltage range 516 and related thresholds are used to identify an ps_sup fault for an AC load speaker (ps_sup_ac). The voltage range 518 corresponds to an ns_gnd fault for a AC load speaker (ns_sup_ac).

In the diagram 500, there is some overlap between the voltage range 506 for ps_sup_dc and the voltage range 508 for ns_gnd_dc. Accordingly, in some example embodiments, if a fault test results in a voltage range 510 near the overlap, a supplemental fault test 520 is performed. In the supplemental fault test 520, the on/off switches (e.g., M5-M8 in FIG. 3) of a sense circuit (e.g., the sense circuit 129 in FIG. 1, or the sense circuit 129A in FIG. 3) are controlled in two test phases 522 and 524. In the first test phase 522, the high-side switches (e.g., M5 and M7) of the sense circuit are turned on. In the second test phase 524, the low-side switches (e.g., M6 and M8) of the sense circuit are turned on. The result of the first and second test phases 522 and 524 are used to distinguish between ps_sup_dc and ns_gnd_dc. Specifically, ps_sup_dc is detectable with a small voltage range (around zero) in the first test phase 522 and a positive voltage range 526 in the second test phase 524. Also, ns_gnd_dc is detectable with a positive voltage threshold range 528 in the first test phase 422 and a small voltage threshold range (around zero) in the second test phase 524. As shown, there is also some overlap between the voltage threshold range 512 for ns_sup_dc and the voltage threshold range 514 for ps_gnd_dc. Accordingly, in some example embodiments, if a fault test results in a voltage range 515 near the overlap, a supplemental fault test is performed to distinguish between ns_sup_dc and ps_gnd_dc.

In some example embodiments, a fault test involves providing a 22 kHz test signal (e.g., provided by an available PWM generator) to the secondary bridge and measuring the average voltage of OUTP-OUTN using an ADC that is calibrated for offset. The ADC path may be trimmed for offset and gain. The average voltage for an AC load speaker is unique and hence the location of shorts can be identified. For a DC load speaker, supplemental tests may be used (e.g., the supplemental fault test 520, or other supplement fault tests) to differentiate ps_sup_dc from ns_gnd_dc and/or to differentiate ns_sup_dc from ps_gnd_dc. In different example embodiments, the upper and lower threshold values for the voltage ranges 502, 504, 506, 508, 512, 514, 516, and 518 may vary. In one example embodiment with a 22 kHz signal as the INPUT, the voltage range 502 is about 6V to 7V, the voltage range 504 is about 2V to 2.5V, the voltage range 506 is about 38 mV to 350 mV, the voltage range 508 is about 15 mV to 154 mV, the voltage range 512 is about −38 mV to −350 mV, the voltage range 514 is about −15 mV to −154 mV, the voltage range 516 is about −2V to −2.5V, and the voltage range 518 is about −6V to −7V. Also, for this example INPUT, the voltage ranges 526 and 528 are about 40 mV to 400 mV (+/−5 mV).

In operation, a controller (e.g., the controller 127 in FIG. 1, or the fault detection controller 312 in FIG. 3) is configured to turn on the first, second, third, and fourth switches (e.g., M5, M6, M7, and M8 in FIG. 3) according to a first pattern to apply the test signal for a fault test. In one example embodiment, the first pattern is a control signal applied to all of the first, second, third, and fourth switches. An example control signal is a 22 kHz signal modulated with a 384 kHz switching frequency. One way to generate this control signal is by comparing a 22 kHz sine wave with a 384 kHz ramp or saw tooth signal. Alternately, the control signal could be generated as a digital signal and level shifting in analog. In response to an inconclusive analysis by the analyzer circuit, the controller is configured to turn on the first, second, third, and fourth switches according to a second pattern. In some example embodiments, the second pattern involves turning on different combinations of the first, second, third, and fourth switches at a time. An example pattern is shown in FIG. 5 with phases 1 and 2. In phase 1, CS5 and CS7 turn on M5 and M7, while CS6 and CS8 turn off M6 and M8 (the phase 1 control signals are labeled "phigh", "nhigh" in FIG. 5). In phase 2, CS6 and CS8 turn on M6 and M8, while CS5 and CS7 turn off M5 and M7 (the phase 2 control signals are labeled "plow", "nlow" in FIG. 5). As needed, an analyzer circuit is configured to: determine that analysis of the measurements results in an ambiguous fault location; and initiate a supplemental fault test to clarify the ambiguous fault location. To reduce undesirable speaker noise during a fault test, the switching amplifier may include a mute circuit coupled to the differential inputs of a driver and configured to performing muting during the fault test.

Figure 6:
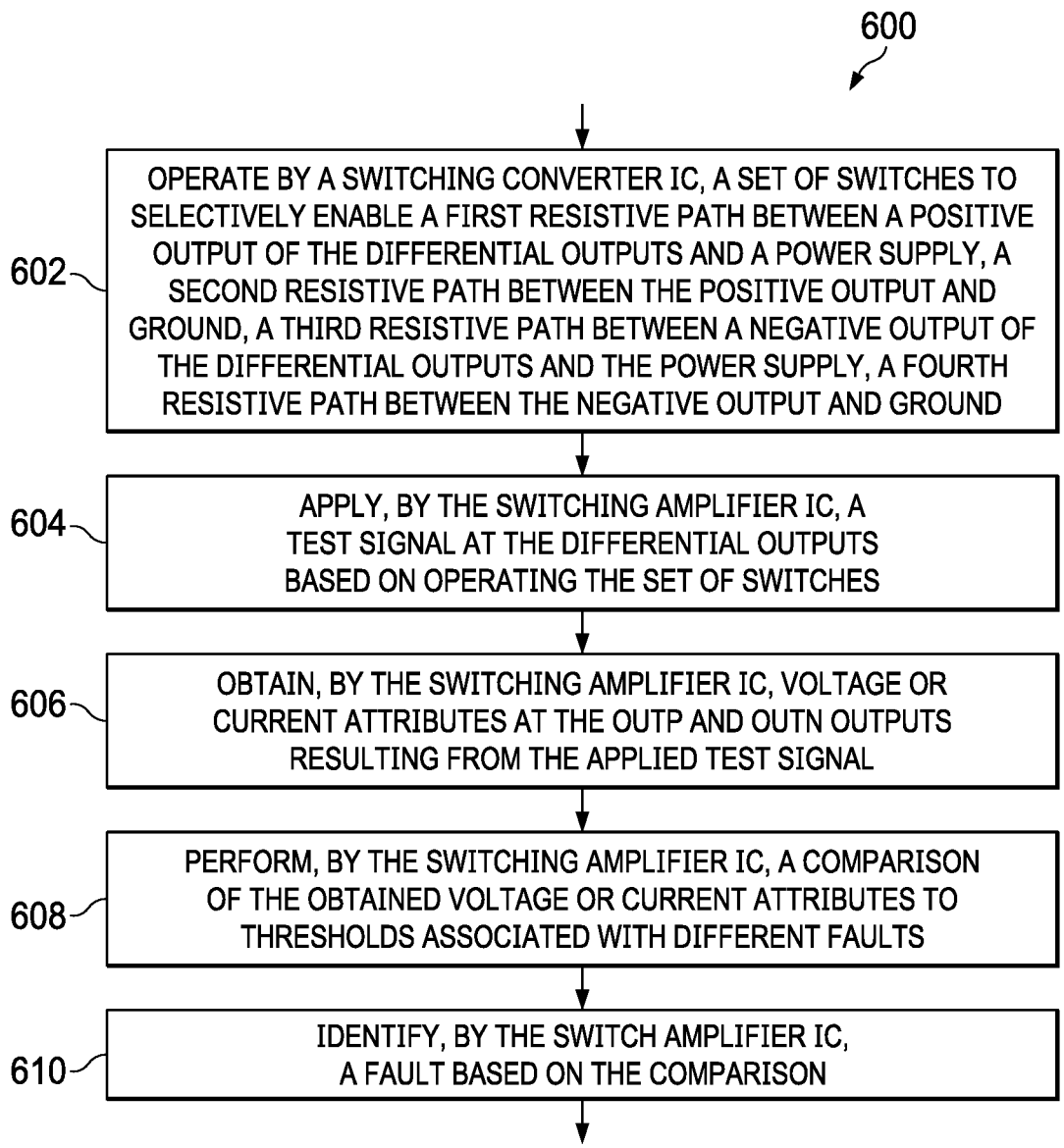
FIG. 6 is a method performed by a switching amplifier integrated circuit (IC) in accordance with an example embodiment.

FIG. 6 is a method 600 performed by a switching amplifier integrated circuit (IC) in accordance with an example embodiment. As shown, the method 600 includes operating, by the switching amplifier IC, a set of switches at block 602 to selectively enable a first resistive path between a positive output of the differential outputs and a power supply, a second resistive path between the positive output and ground, a third resistive path between a negative output of the differential outputs and the power supply, a fourth resistive path between the negative output and ground. At block 604, the switching amplifier IC applies a test signal at the differential outputs. At block 606, the switching amplifier IC obtains voltage or current attributes at the OUTP and OUTN outputs resulting from the applied test signal. At block 608, the switching amplifier IC performs a comparison of the obtained voltage or current attributes to thresholds associated with different faults. At block 610, the switching amplifier IC identifies a fault based on the comparison.

In some example embodiments, the method 600 includes: determining, by the switching amplifier IC, that a location of the fault is inconclusive; performing, by the switching amplifier IC, a supplemental fault test by closing each of the switches in the set of switches during separate test intervals; and applying, by the switching amplifier IC, a supplemental fault test signal at the differential outputs during each of the separate test intervals. The method 600 may also include: obtaining, by the switching amplifier IC, voltage or current attributes at the differential outputs resulting from of the applied supplemental fault test signal; performing, by the switching amplifier IC, a comparison of the voltage or current attributes to thresholds associated with different faults; and identifying, by the switch amplifier IC, a fault location based on the comparison.

With the described fault detection circuit and related switching amplifier scenarios, the location of faults (whether the short is relative to PVDD or ground for either of the differential outputs) is possible using various existing blocks/resources that are part of a switching amplifier (e.g., a class D feedback amplifier). Accordingly, the described fault detection circuit is lower cost relative to conventional approaches. Alternate solutions may involve a separate DAC to force current and measure the voltage using single ended ADC. The solution needs separate new blocks, which will increase cost and circuit size. By using the fault detection techniques proposed, an available PWM generator for the switching amplifier is used to generate a test signal. By selecting a test signal with excitation frequencies >20 khz, the audible artefacts can be minimized. Also, the described fault detection technique is independent of variations caused by low frequency cut off beads.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal", "node", "interconnection", "pin", "contact", and "connection" are used interchangeably. Unless specifically stated to the contrary, these terms are generally used to mean an interconnection between or a terminus of a device element, a circuit element, an integrated circuit, a device or other electronics or semiconductor component.

While the example embodiments above utilize nMOS transistors, other example embodiments may utilize pMOS transistors, NPN bipolar junction transistors (BJTs), PNP BJTs, or any other type of transistor. Hence, when referring to a current terminal, such terminal may be an emitter, collector, source or drain. In addition, the control terminal may be a base or a gate.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:
1. A system, comprising:
 a driver circuit with differential inputs and differential outputs;
 a fault detection circuit having differential inputs, a power supply input and an output, wherein the differential inputs of the fault detection circuit are coupled to the differential outputs of the driver circuit, wherein the fault detection circuit includes:
a sense circuit having differential inputs and an output wherein the differential inputs of the sense circuit are coupled to the differential inputs of the fault detection circuit; the sense circuit including:
a first resistor between the power supply input and a positive output of the differential outputs of the driver circuit;
a second resistor between the positive output and ground;
a third resistor between the power supply input and a negative output of the differential outputs of the driver circuit; and
a fourth resistor between the negative output and ground; and
a voltage sense circuit having differential inputs and an output wherein the differential inputs of the voltage sense circuit are coupled to the inputs of the sense circuit; and
an analyzer circuit having an input coupled to the output of the voltage sense circuit and configured to determine a fault location based on an output of the voltage sense circuit.

2. The system of claim 1, wherein the sense circuit includes:
a first switch between the power supply input and the positive output;
a second switch between the positive output and ground;
a third switch between the power supply input and a negative output of the differential outputs; and
a fourth switch between the negative output and ground; and
a controller configured to control on and off states of the first, second, third, and fourth switches in accordance with a fault test that applies a test signal to the differential output, the test signal having a frequency below 20 Hz or above 20 kHz.

3. The system of claim 2, wherein the controller is configured to turn on the first, second, third, and fourth switches according to a first pattern to apply to the test signal.

4. The system of claim 3, wherein the controller is configured to turn on the first, second, third, and fourth switches according to a second pattern to perform a supplemental fault test in response to an inconclusive analysis by the analyzer circuit.

5. The system of claim 2, wherein the analyzer circuit is configured to:
determine that analysis of the measurements results in an ambiguous fault location; and
initiate a supplemental fault test to clarify the ambiguous fault location.

6. The system of claim 1, wherein the analyzer circuit includes comparators coupled to the voltage or current sense circuit and configured to compare the measurements with predetermined thresholds associated with a positive output short to power supply fault, a negative output short to power supply fault, a positive output short to ground fault, and a negative output short to ground fault.

7. The system of claim 1, wherein the analyzer circuitry includes:
an analog-to-digital converter (ADC) with an ADC input and ADC output, the ADC input coupled to the voltage or current sense circuit, and the ADC configured to digitize the measurements; and
a processor coupled to the ADC output and configured to:
perform a comparison of the digitized measurements with predetermined thresholds associated with a positive output short to power supply fault, a negative output short to power supply fault, a positive output short to ground fault, and a negative output short to ground fault; and
determine the fault location based on the comparison.

8. The system of claim 1, wherein the sense circuit or the analyzer circuit is configured to average measurements obtained by the voltage or current sense circuit over time, and the analyzer circuit is configured to analyze the averaged measurements to determine the fault location.

9. The system of claim 1, wherein the system further includes a mute circuit coupled to the differential inputs of the driver and configured to performing muting during the fault test.

10. The system of claim 1, wherein the driver circuit and the fault detection circuit are part of an integrated circuit.

11. A system, comprising:
a switching amplifier with differential inputs and differential outputs; and
a fault detection circuit having differential inputs, a power supply input, and an output, wherein the differential inputs of the fault detection circuit are coupled to the differential outputs of the switching amplifier wherein the fault detection circuit further includes:
a sense circuit having differential inputs and an output wherein the differential inputs of the sense circuit are coupled to the differential inputs of the fault detection circuit;
a first resistive path with a first switch coupled between a positive output of the differential outputs and a power supply;
a second resistive path with a second switch coupled between the positive output of the differential outputs and ground;
a third resistive path with a third switch coupled between a negative output of the differential outputs and the power supply
a fourth resistive path with a fourth switch coupled between the negative output of the differential outputs and ground; and
a voltage sense circuit having differential inputs and an output wherein the differential inputs of the voltage sense circuit are coupled to the inputs of the sense circuit; and
an analyzer circuit having an input coupled to the output of the voltage sense circuit and configured to determine a fault location based on an output of the voltage sense circuit.

12. The system of claim 11, wherein the sense circuit includes a controller configured to control on/off states of the first, second, third, and fourth switches in accordance with a fault test that applies the test signal with a frequency below 20 Hz or above 20 kHz.

13. The system of claim 12, wherein the controller is configured to turn on the first, second, third, and fourth switches according to a first pattern to apply the test signal.

14. The system of claim 13, wherein the controller is configured to turn on the first, second, third, and fourth switches according to a second pattern in response to an inconclusive analysis by the analyzer circuit.

15. The system of claim 12, wherein the analyzer circuit is configured to:
determine that analysis of the measurements results in an ambiguous fault location; and initiate a supplemental fault test to clarify the ambiguous fault location.

16. The system of claim 11, wherein the analyzer circuit includes comparators coupled to the output of the voltage sense circuit and configured to compare the voltage on the output of the voltage sense circuit with predetermined thresholds associated with a positive output short to power supply fault, a negative output short to power supply fault, a positive output short to ground fault, and a negative output short to ground fault.

17. The system of claim 11, wherein the analyzer circuitry includes:
- an analog-to-digital converter (ADC) with an ADC input and ADC output, the ADC input coupled to the input of the analyzer circuitry and the ADC configured to digitize the voltage on the output of the voltage sense circuit; and
- a processor coupled to the ADC output and configured to:
    - perform a comparison of the digitized voltage on the output of the voltage sense circuit with predetermined thresholds associated with a positive output short to power supply fault, a negative output short to power supply fault, a positive output short to ground fault, and a negative output short to ground fault; and
    - determine the fault location based on the comparison.

18. The system of claim 11, further comprising:
- an audio source coupled the differential inputs;
- a mute circuit coupled between the audio input source and the differential inputs;
- a speaker coupled to the differential outputs; and
- a controller coupled to the mute circuit and configured to mute signaling through the mute circuit during a fault test.

19. The system of claim 11, wherein the switching amplifier and the fault detection circuit are part of an integrated circuit.

\* \* \* \* \*